United States Patent
Ben-Meir et al.

[11] Patent Number: 5,898,640
[45] Date of Patent: Apr. 27, 1999

[54] EVEN BUS CLOCK CIRCUIT

[75] Inventors: Amos Ben-Meir, Cupertino; Matthew P. Crowley, San Jose, both of Calif.

[73] Assignee: Advanced Micro Devices, Inc., Sunnyvale, Calif.

[21] Appl. No.: 08/938,219

[22] Filed: Sep. 26, 1997

[51] Int. Cl.$^6$ ...................................................... G11C 8/00
[52] U.S. Cl. ........................ 365/233; 365/194; 327/145; 327/218; 395/551
[58] Field of Search ................................. 365/233, 194; 327/141, 144, 145, 161, 175, 172, 199, 218, 299, 291, 298

[56] References Cited

U.S. PATENT DOCUMENTS

| | | | |
|---|---|---|---|
| 4,604,582 | 8/1986 | Strenkowski et al. | 328/55 |
| 4,845,437 | 7/1989 | Mansur et al. | 328/15 |
| 5,422,914 | 6/1995 | Snyder | 375/354 |
| 5,537,582 | 7/1996 | Dreager | 395/550 |
| 5,568,075 | 10/1996 | Curran et al. | 327/291 |
| 5,634,116 | 5/1997 | Singer | 395/550 |
| 5,748,541 | 5/1998 | Nii | 365/233 |

OTHER PUBLICATIONS

H. Taub and D. Schilling, *Digital Integrated Electronics*, Chapter 10, pp. 322–355 (1977).

*Primary Examiner*—David Nelms
*Assistant Examiner*—Tuan T. Nguyen
*Attorney, Agent, or Firm*—Skjerven, Morrill MacPherson, Franklin & Friel, L.L.P.

[57] ABSTRACT

An even bus clock circuit generates logic pulses in response to substantially coincident rising edges of a processor clock and a bus clock over a given range of processor clock to bus clock ratios that includes whole integers and half integers. The even bus clock circuit includes a delay element for receiving the bus clock and generating a delayed bus clock, a first flip-flop for receiving the processor clock at a data input and receiving the delayed bus clock at a clock input, and a second flip-flop for receiving a data output of the first flip-flop at a data input, receiving the processor clock at a clock input and generating a data output that is coupled to an asynchronous reset input of the first flip-flop. The logic pulses are generated at the data output of the first flip-flop and have a pulse width of substantially the same duration as a single cycle of the processor clock.

30 Claims, 3 Drawing Sheets

EVEN BUS CLOCK CIRCUIT

BACKGROUND OF THE INVENTION

1. Field of the Invention

The present invention relates to electronic circuits, and more particularly to logic circuits that generate logic pulses in response to coincident edges of processor clocks and bus clocks.

2. Description of Related Art

In computer systems, the processor clock usually has a far higher frequency than the bus clock. For example, in personal computers (PC's or Pentium™-compatible systems), the processor clock normally runs at least twice as fast as the bus clock. As newer generations of processors become available for personal computers, processor clock speeds tend to exceed bus clock speeds by increasingly wide margins. In order to facilitate compatibility between the processor and the bus, processors are often designed so that the processor clock to bus clock ratio is a whole integer or a half integer. Typical processor clock to bus clock ratios for personal computers are listed below in Table 1.

TABLE 1

PROCESSOR CLOCK TO BUS CLOCK RATIOS

| Processor Clock Frequency | Bus Clock Frequency | Ratio |
|---|---|---|
| 133 MHz | 66 MHz | 2 |
| 200 MHz | 66 MHz | 3 |
| 233 MHz | 66 MHz | 3.5 |
| 266 MHz | 66 MHz | 4 |
| 300 MHz | 66 MHz | 4.5 |

Processors often include synchronization circuitry such as a phase-locked loop for establishing a timing relationship between the processor clock and the bus clock. Consequently, when the processor clock to bus clock ratio is whole integer, each rising edge of the bus clock is coincident with a rising edge of the processor clock. However, when the processor clock to bus clock ratio is a half integer, then alternating rising edges (such as even rising edges) of the bus clock are coincident with rising edges of the processor clock, and the other rising edges (such as odd rising edges) of the bus clock are not coincident with rising edges of the processor clock.

In order to coordinate operations between the processor and the bus, it may be necessary to generate a logic signal that goes active for a single processor clock cycle every time a rising edge of the processor clock coincides with a rising edge of the bus clock. In the event the processor clock to bus clock ratio is a whole integer, the logic signal becomes active upon each rising edge of the bus clock. On the other hand, when the processor clock to bus clock ratio is a half integer, the logic signal goes active only upon alternate rising edges of the bus clock.

In a processor family with similar functionality across a wide range of processor clock speeds (such as 200 MHz, 233 MHz and 266 MHz), it is highly desirable to use the same circuitry in as much of the processor as possible, despite the differing clock speeds. A logic circuit that generates the logic signal described above whenever a rising edge of the bus clock is detected is suitable when the processor clock to bus clock ratio is a whole integer but not a half integer. Similarly, a logic circuit that generates the logic signal described above whenever an alternate rising edge of the bus clock is detected is suitable when the processor clock to bus clock ratio is a half integer but not a whole integer.

Accordingly, a need exists for an even bus clock circuit that generates logic pulses in response to substantially coincident rising edges of a processor clock and a bus clock over a range of processor clock to bus clock ratios that includes whole integers and half integers, particularly where the even bus clock circuit is compact and efficient.

SUMMARY OF THE INVENTION

The present invention provides an even bus clock circuit which fulfills the need in the art described above.

In accordance with one aspect the invention, an even bus clock circuit includes a delay element for receiving the bus clock and generating a delayed bus clock, a first flip-flop for receiving the processor clock at a data input and receiving the delayed bus clock at a clock input, and a second flip-flop for receiving a data output of the first flip-flop at a data input, receiving the processor clock at a clock input and generating a data output that is coupled to an asynchronous reset input of the first flip-flop. Logic pulses of the even bus clock are generated at the data output of the first flip-flop and have a pulse width of substantially the same duration as a single cycle of the processor clock.

Preferably, the flip-flops are rising edge triggered D-type flip-flops, and the delay element is a string of successive inverters.

If desired, the even bus clock circuit may include a logic gate that generates the logic pulses as a logical AND of the data output of the first flip-flop and a complement of the data output of the second flip-flop to reduce the delay between the rising edges of the processor clock and corresponding falling edges of the logic pulses.

The even bus clock circuit is particularly well-suited for processor clock to bus clock ratios in the range of 2 to 5.5 (including these numbers and the whole integers and half integers therebetween) based upon a bus clock frequency of about 66 MHz. Moreover, the even bus clock circuit is compact and efficient.

These and other objects, features and advantages of the invention will be further described and more readily apparent from a review of the detailed description of the preferred embodiments which follow.

DETAILED DESCRIPTION OF THE PREFERRED EMBODIMENTS

Figure 1:
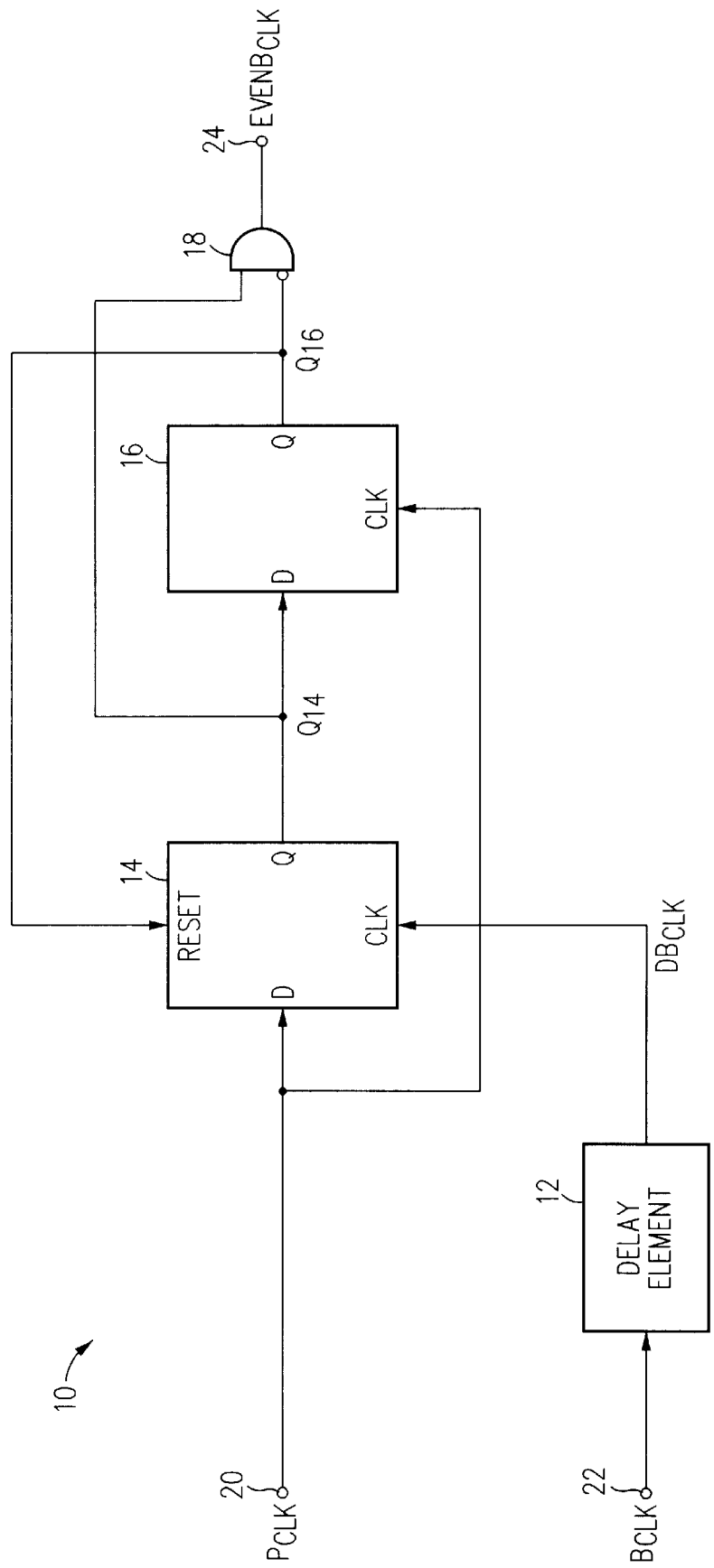
FIG. 1 is a schematic diagram of an even bus clock circuit in accordance with an embodiment of the present invention.

FIG. 1 is a schematic diagram of even bus clock circuit 10 in accordance with an embodiment of the present invention. Even bus clock circuit 10 includes delay element 12, flip-flops 14 and 16, and logic gate 18. Delay element 12 introduces a delay into the signal applied to its input without changing the logical value of the signal. Delay element 12 can be implemented, for instance, by a chain of successive inverters, to provide a propagation delay in the range of about 500 to 800 picoseconds. Flip-flops 14 and 16 are D-type flip-flops with data inputs ("D"), data outputs ("Q") and clock inputs ("clk"). Flip-flops 14 and 16 are triggered by rising edges of the signals applied to their respective clock inputs. In addition, flip-flop 14 includes an asynchronous reset input ("reset"). When a high value (or logical "1") is applied to the asynchronous reset input, the data output of flip-flop 14 is forced to a low value (or logical "0") regardless of the signals applied to its data input or clock input. When a low value is applied to the asynchronous reset input, flip-flop 14 returns to normal operation. Logic gate 18 generates the logical AND of the data output of flip-flop 14 and the complement of the data output of flip-flop 16.

A processor clock ("$P_{CLK}$") is applied to input terminal 20, and a bus clock ("$B_{CLK}$") is applied to input terminal 22. As is seen, input terminal 20 is coupled to the data input of flip-flop 14 and the clock input of flip-flop 16, and input terminal 22 is coupled to the input of delay element 12. The output of delay element 12 is coupled to the clock input of flip-flop 14. The data output of flip-flop 14 is coupled to the data input of flip-flop 16 and the non-inverting input of logic gate 18, and the data output of flip-flop 16 is coupled to the asynchronous reset input of flip-flop 14 and the inverting input of logic gate 18. An even bus clock ("$EVENB_{CLK}$") is generated at output terminal 24.

The processor clock operates at a greater speed than the bus clock, and the processor clock to bus clock ratio can be a whole integer or a half integer. In either case, the even bus clock provides a logic pulse (or logical "1") each time substantially coincident rising edges of the processor clock and the bus clock occur, and the logic pulse has a pulse width that is similar to the duration of a single processor clock cycle. Accordingly, even bus clock circuit 10 generates a logic pulse for each rising edge of the bus clock when the processor clock to bus clock ratio is a whole integer, and generates a logic pulse for every other rising edge of the bus clock when the processor clock to bus clock ratio is a half integer.

Although certain rising edges of the processor clock are intended to be precisely coincident with certain rising edges of the bus clock, in practice these rising edges are often offset from one another. That is, the rising edge of the processor clock slightly leads or lags the rising edge of the bus clock. Phase-locked loop induced jitter is a common source of this problem. Nevertheless, even bus clock circuit 10 accommodates this timing uncertainty by using delay element 12 to generate a delayed bus clock ("$DB_{CLK}$"). Delay element 12 introduces a delay into the bus clock that exceeds the maximum allowable timing difference between rising edges of the processor clock and the bus clock that are intended to be coincident with on another. Therefore, for each rising edge of the bus clock that is intended to be coincident with a rising edge of the processor clock, the corresponding rising edge of the delayed bus clock lags that rising edge of the processor clock. As a result, when substantially coincident rising edges of the processor clock and the bus clock occur, delay element 12 assures that the rising edge of the processor clock is applied to the data input of flip-flop 14 and the clock input of flip-flop 16 before the corresponding rising edge of the delayed bus clock is applied to the clock input of flip-flop 14.

It should be noted, however, that delay element 12 introduces a small enough delay to assure that the rising edge of the delayed bus clock is applied to the clock input of flip-flop 14 before the next falling edge of the processor clock occurs.

Figure 2:
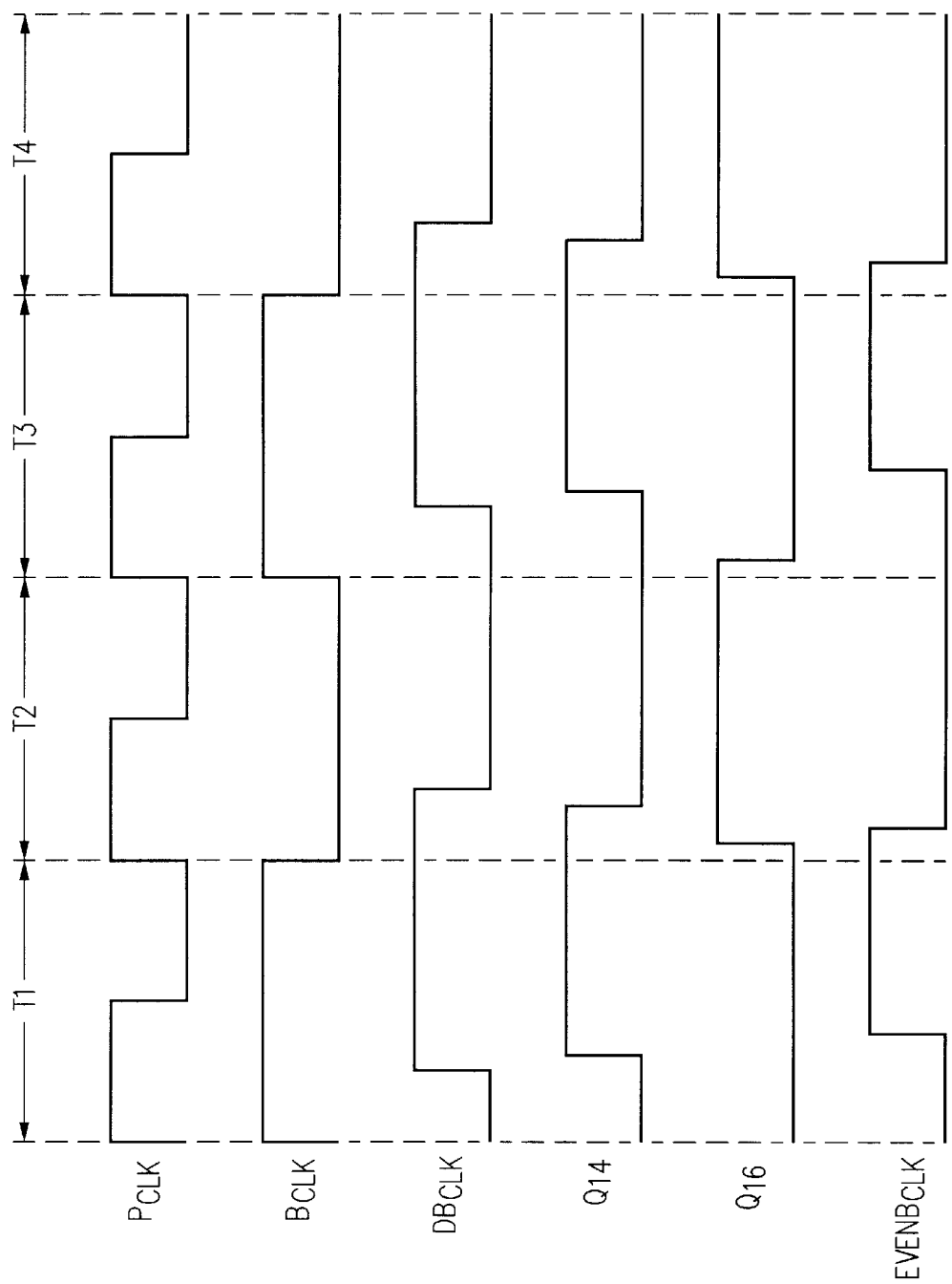
FIG. 2 is a signal diagram for the even bus clock circuit of FIG. 1 when the processor clock to bus clock ratio is 2.
Figure 3:
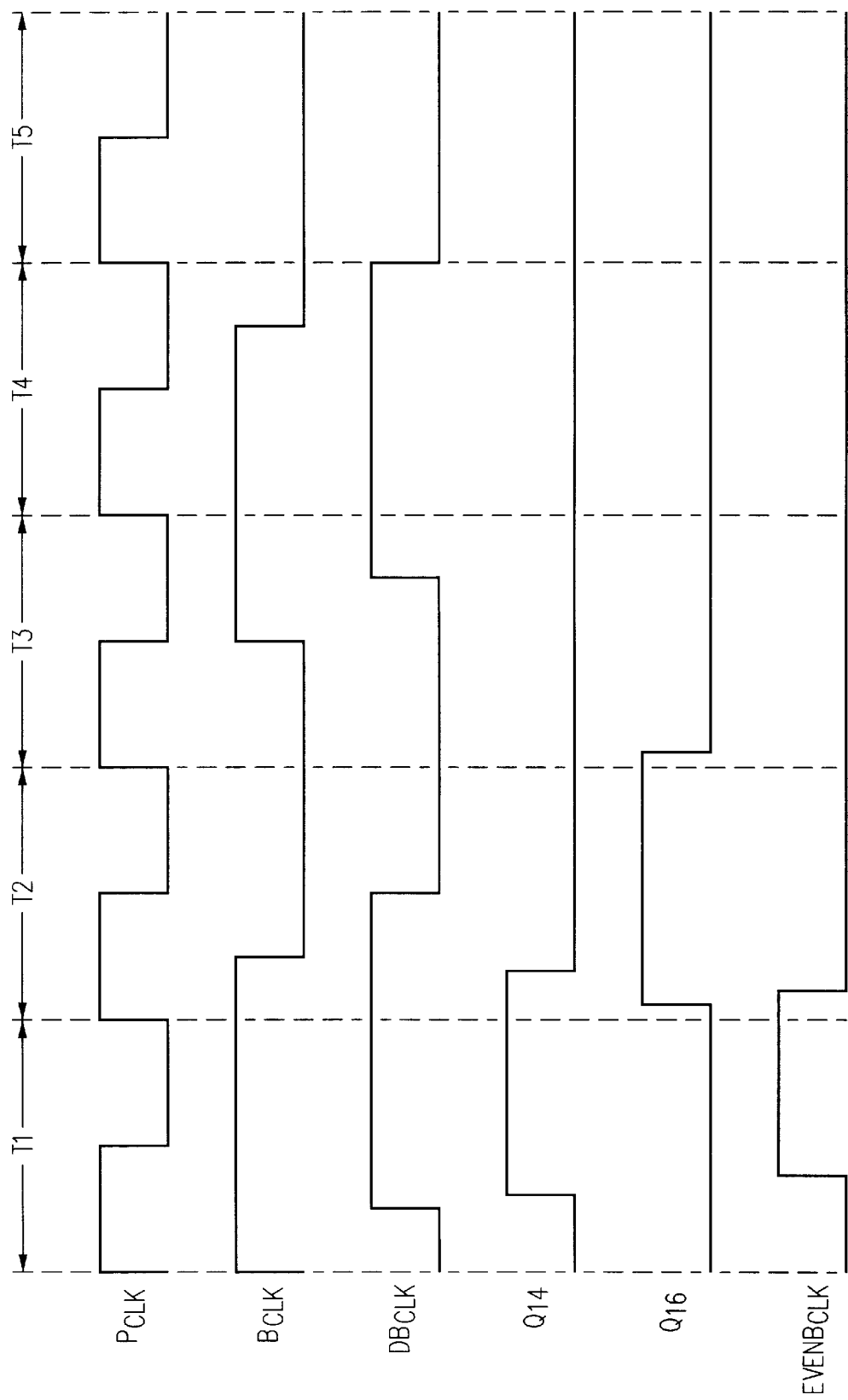
FIG. 3 is a signal diagram for the even bus clock circuit of FIG. 1 when the processor clock to bus clock ratio is 2.5.

FIGS. 2 and 3 are signal diagrams for even bus clock circuit 10 in which the processor clock to bus clock ratio is 2 (FIG. 2) and 2.5 (FIG. 3). For convenience of explanation, the data output of flip-flop 14 is designated "$Q_{14}$", and the data output of flip-flop 16 is designated "$Q_{16}$".

Referring now to FIG. 2, the processor clock is running at twice the frequency of the bus clock, and therefore, two processor clock cycles occur for each bus clock cycle, and the processor clock to bus clock ratio is 2. Thus, each rising edge of the bus clock is substantially coincident with a rising edge of the processor clock. Furthermore, each logic pulse of the even bus clock is asserted in response to each rising edge of the bus clock, and is deasserted in response to each rising edge of the processor clock following the substantially coincident rising edge of the processor clock. Four consecutive processor clock cycles occur during time periods T1 to T4. Initially, the data outputs of flip-flops 14 and 16 are low, and logic gate 18 receives a low signal at the non-inverting input and generates a low even bus clock.

During T1, initially the processor clock and the bus clock transition high at about the same time. Flip-flop 16 triggers while receiving a low data input and continues to generate a low data output. Thereafter, the delayed bus clock transitions high, and flip-flop 14 triggers while receiving a high data input and generates a high data output. Since logic gate 18 receives low and high signals at the inverting and non-inverting inputs, respectively, the even bus clock transitions high. Thereafter, the processor clock transitions low.

During T2, initially the processor clock transitions high and the bus clock transitions low at about the same time. Flip-flop 16 triggers while receiving a high data input and generates a high data output. Since logic gate 18 receives a high signal at the inverting input, the even bus clock transitions low. In addition, since flip-flop 14 receives a high signal at the asynchronous reset input, the data output of flip-flop 14 transitions low. Thereafter, the processor clock and the delayed bus clock transition low.

During T3, initially the processor clock and the bus clock transition high at about the same time. Flip-flop 16 triggers while receiving a low data input and generates a low data output. Therefore, a low signal is applied to the asynchronous reset input of flip-flop 14, and flip-flop 14 returns to normal operation. Since logic gate 18 continues to receive a low signal at the non-inverting input, the even bus clock continues to be low. Thereafter, the delayed bus clock transitions high, and flip-flop 14 triggers while receiving a high data input and generates a high data output. Since logic gate 18 receives low and high signals at the inverting and non-inverting inputs, respectively, the even bus clock transitions high. Thereafter, the processor clock transitions low.

During T4, initially the processor clock transitions high and the bus clock transitions low at about the same time. Flip-flop 16 triggers while receiving a high data input and generates a high data output. Since logic gate 18 receives a high signal at the inverting input, the even bus clock transitions low. In addition, since flip-flop 14 receives a high signal at the asynchronous reset input, the data output of flip-flop 14 transitions low. Thereafter, the processor clock and the delayed bus clock transition low.

Referring now to FIG. 3, the processor clock is running at two and one-half times the frequency of the bus clock, and therefore, five processor clock cycles occur for every two bus clock cycles, and the processor clock to bus clock ratio is 2.5. Thus, every other rising edge of the bus clock is substantially coincident with a rising edge of the processor clock. Furthermore, each logic pulse of the even bus clock is asserted in response to every other rising edge of the bus clock, and is deasserted in response to each rising edge of the processor clock following the substantially coincident rising edge of the processor clock. Five consecutive processor clock cycles occur during time periods T1 to T5. Initially, the data outputs of flip-flops 14 and 16 are low, and logic gate 18 receives a low signal at the non-inverting input and generates a low even bus clock.

During T1, initially the processor clock and the bus clock transition high at about the same time. Flip-flop 16 triggers while receiving a low data input and continues to generate a low data output. Thereafter, the delayed bus clock transitions high, and flip-flop 14 triggers while receiving a high data input and generates a high data output. Since logic gate 18 receives high and low signals at the non-inverting and inverting inputs, respectively, the even bus clock transitions high. Thereafter, the processor clock transitions low.

During T2, initially the processor clock transitions high. Flip-flop 16 triggers while receiving a high data input and generates a high data output. Since logic gate 18 receives a high signal at the inverting input, the even bus clock transitions low. In addition, since flip-flop 14 receives a high signal at the asynchronous reset input, the data output of flip-flop 14 transitions low. Thereafter, the bus clock transitions low, and then the processor clock and the delayed bus clock transition low.

During T3, initially the processor clock transitions high. Flip-flop 16 triggers while receiving a low data input and generates a low data output. Therefore, a low signal is applied to the asynchronous reset input of flip-flop 14, and flip-flop 14 returns to normal operation. Since logic gate 18 receives a low signal at the non-inverting input, the even bus clock continues to be low. Thereafter, the processor clock transitions low and the bus clock transitions high at about the same time. Thereafter, the delayed bus clock transitions high, and flip-flop 14 triggers while receiving a low data input and continues to generate a low data output.

During T4, initially the processor clock transitions high. Flip-flop 16 triggers while receiving a low data input and continues to generate a low data output. Thereafter, the processor clock transitions low, and then the bus clock transitions low. Since logic gate 18 continues to receive a low signal at the non-inverting input, the even bus clock remains low.

During T5, initially the processor clock transitions high and the delayed bus clock transitions low at about the same time. Flip-flop 16 triggers while receiving a low data input and continues to generate a low data output. Thereafter, the processor clock transitions low. Since logic gate 18 continues to receive a low signal at the non-inverting input, the even bus clock remains low.

Numerous variations can be made to the embodiment described above. For instance, delay element 12 can be implemented with various circuitry that introduces a propagation delay, flip-flops 14 and 16 can be implemented with various latching elements, and logic gate 18 can be implemented with various transistor configurations that provide the desired boolean function. The logic values of various signals can be reversed while retaining the desired functionality; for instance, delay element 12 can be an inverter (or an odd number of successive inverter stages) if flip-flop 14 triggers on the falling edge of its clock signal.

Moreover, even bus clock circuit 10 generates an even bus clock at numerous locations. For instance, an even bus clock is generated at the data output of flip-flop 14, and at the data output of flip-flop 16. Thus, logic gate 18 is not essential. However, in comparison to the even bus clock generated at the data output of flip-flop 14, logic gate 18 generates an even bus clock with a falling edge that is closer to the corresponding rising edge of the processor clock since the delay time of logic gate 18 is less than the asynchronous reset time of flip-flop 14.

Even bus clock circuit 10 can accommodate a wide range of processor clock to bus clock ratios that include whole integers and half integers, particularly in the range of 2 to 5.5 based upon a bus clock frequency of about 66 MHz.

Other variations and modifications of the embodiments disclosed herein may be made based on the description set forth herein without departing from the scope and spirit of the invention as set forth in the following claims.

What is claimed is:

1. An even bus clock circuit, comprising:
   a delay element for receiving a bus clock and generating a delayed bus clock;
   a first flip-flop for receiving a processor clock at a data input and receiving the delayed bus clock at a clock input; and
   a second flip-flop for receiving a data output of the first flip-flop at a data input, receiving the processor clock at a clock input, and generating a data output that is coupled to an asynchronous reset input of the first flip-flop.

2. The even bus clock circuit of claim 1, wherein the first and second flip-flops are rising edge triggered flip-flops.

3. The even bus clock circuit of claim 1, wherein the data output of the first flip-flop generates pulses in response to substantially coincident rising edges of the processor clock and the bus clock for a range of processor clock to bus clock ratios that includes whole integers and half-integers.

4. The even bus clock circuit of claim 1, wherein the processor clock to bus clock ratio is in the range of 2 to 5.5.

5. An even bus clock circuit for generating logic pulses in response to substantially coincident rising edges of a processor clock and a bus clock over a given range of processor clock to bus clock ratios that includes whole integers and half integers, comprising:
   a delay element for receiving the bus clock and generating a delayed bus clock;
   a first rising edge triggered flip-flop for receiving the processor clock at a data input, receiving the delayed bus clock at a clock input, and generating the logic pulses at a data output; and
   a second rising edge triggered flip-flop for receiving the data output of the first flip-flop at a data input, receiving the processor clock at a clock input, and generating a reset control signal at a data output that is coupled to an asynchronous reset input of the first flip-flop.

6. The even bus clock circuit of claim 5, wherein the delay element is a string of successive inverters.

7. The even bus clock circuit of claim 5, wherein the delay element introduces a delay between the bus clock and the delayed bus clock in the range of about 500 to 800 picoseconds.

8. The even bus clock circuit of claim 5, wherein for each rising edge of the bus clock that is substantially coincident with a rising edge of the processor clock, the delayed bus clock has a rising edge that lags the rising edge of the processor clock.

9. The even bus clock circuit of claim 5, wherein the range of processor clock to bus clock ratios is 2 to 5.5.

10. The even bus clock circuit of claim 9, wherein the processor clock has a frequency selected from the group consisting of about 133 MHz, 166 MHz, 200 MHz, 233 MHz, 266 MHz, 300 MHz, 333 MHz and 366 MHz, and the bus clock has a frequency of about 66 MHz.

11. The even bus clock circuit of claim 5, wherein the range of processor clock to bus clock ratios is 3 to 4.5.

12. The even bus clock circuit of claim 11, wherein the processor clock has a frequency selected from the group consisting of about 200 MHz, 233 MHz, 266 MHz and 300 MHz, and the bus clock has a frequency of about 66 MHz.

13. The even bus clock circuit of claim 5, including a logic gate that generates a logical AND of the data output of the first flip-flop and a complement of the data output of the second flip-flop.

14. The even bus clock circuit of claim 5, wherein the logic pulses have a pulse width of substantially the same duration as a single cycle of the processor clock.

15. An even bus clock circuit for generating logic pulses in response to substantially coincident rising edges of a processor clock and a bus clock over a given range of processor clock to bus clock ratios that includes whole integers and half integers, comprising:

a processor clock input terminal for receiving the processor clock;

a bus clock input terminal for receiving the bus clock;

a delay element with an input coupled to the bus clock input terminal;

a first rising edge triggered flip-flop with a data input coupled to the processor clock input terminal, a clock input coupled to an output of the delay element, an asynchronous reset input, and a data output for generating the logic pulses; and a second rising edge triggered flip-flop with a data input coupled to the data output of the first flip-flop, a clock input coupled to the processor input terminal, and a data output coupled to the asynchronous reset input of the first flip-flop.

16. The even bus clock circuit of claim 15, wherein the first and second flip-flops are D-type flip-flops.

17. The even bus clock circuit of claim 15, including a logic gate that generates a logical AND of the data output of the first flip-flop and a complement of the data output of the second flip-flop.

18. The even bus clock circuit of claim 15, wherein the range of processor clock to bus clock ratios is 2 to 5.5.

19. The even bus clock circuit of claim 15, wherein the logic pulses have a pulse width of substantially the same duration as a single cycle of the processor clock.

20. A method of generating logic pulses in response to substantially coincident rising edges of a processor clock and a bus clock over a given range of processor clock to bus clock ratios that includes whole integers and half integers, comprising:

generating a delayed bus clock in response to the bus clock;

applying the delayed bus clock to a clock input of a first flip-flop;

applying the processor clock to a data input of the first flip-flop and to a clock input of a second flip-flop;

applying a data output of the first flip-flop to a data input of the second flip-flop; and applying a data output of the second flip-flop to an asynchronous reset input of the first flip-flop.

21. The method of claim 20, including triggering the first and second flip-flops in response to rising edges of signals applied to their respective clock inputs.

22. The method of claim 20, including generating the logic pulses at the data output of the first flip-flop.

23. The method of claim 20, including generating the logic pulses at an output of a logic gate that provides a logical AND of the data output of the first flip-flop and a complement of the data output of the second flip-flop.

24. The method of claim 20, including:

generating the bus clock with rising edges which are substantially coincident with non-adjacent rising edges of the processor clock; and generating the delayed bus clock with rising edges which trail the rising edges of the bus clock and the non-adjacent rising edges of the processor clock.

25. The method of claim 24, wherein the processor clock to bus clock ratio is a whole integer, and every rising edge of the bus clock is substantially coincident with a rising edge of the processor clock.

26. The method of claim 24, wherein the processor clock to bus clock ratio is a half integer, every even rising edge of the bus clock is substantially coincident with a rising edge of the processor clock, and every odd rising edge of the bus clock is not substantially coincident with a rising edge of the processor clock.

27. The method of claim 20, wherein the range of processor clock to bus clock ratios is 2 to 5.5.

28. The method of claim 27, wherein the processor clock has a frequency selected from the group consisting of about 133 MHz, 166 MHz, 200 MHz, 233 MHz, 266 MHz, 300 MHz, 333 MHz and 366 MHz, and the bus clock has a frequency of about 66 MHz.

29. The method of claim 20, wherein the logic pulses have a pulse width of substantially the same duration as a single cycle of the processor clock.

30. A method of generating even bus clock pulses in response to substantially coincident rising edges of a processor clock and a bus clock over a given range of processor clock to bus clock ratios that consists of whole integers and half integers between and including 2 to 5.5, such that the even bus clock pulses have a pulse width of substantially the same duration as a single cycle of the processor clock, comprising:

generating a delayed bus clock in response to the bus clock;

applying the delayed bus clock to a clock input of a first rising edge triggered D-type first flip-flop;

applying the processor clock to a data input of the first flip-flop and to a clock input of a second rising edge triggered D-type flip-flop;

applying a data output of the first flip-flop to a data input of the second flip-flop; and applying a data output of the second flip-flop to an asynchronous reset input of the first flip-flop.

* * * * *